United States Patent
Lee et al.

(10) Patent No.: US 12,483,154 B2
(45) Date of Patent: Nov. 25, 2025

(54) POWER CONVERSION APPARATUS

(71) Applicants: Hyundai Motor Company, Seoul (KR); Kia Corporation, Seoul (KR)

(72) Inventors: Woo Young Lee, Yongin-Si (KR); Sae Kwon Chang, Yongin-Si (KR); Yoon-Tae Kim, Seongnam-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 288 days.

(21) Appl. No.: 18/210,562

(22) Filed: Jun. 15, 2023

(65) Prior Publication Data

US 2024/0195315 A1 Jun. 13, 2024

(30) Foreign Application Priority Data

Dec. 7, 2022 (KR) .......................... 10-2022-0169721

(51) Int. Cl.
*H02M 7/00* (2006.01)
*H05K 5/03* (2006.01)
*H05K 7/20* (2006.01)

(52) U.S. Cl.
CPC .............. *H02M 7/003* (2013.01); *H05K 5/03* (2013.01); *H05K 7/20927* (2013.01)

(58) Field of Classification Search
CPC .. H02M 7/003; H02M 3/155; H02M 3/33573; H02M 7/00; H02M 3/003; H05K 5/03; H05K 7/20927; H05K 7/209; H05K 7/20263; H05K 7/20272
See application file for complete search history.

(56) References Cited

U.S. PATENT DOCUMENTS

| | | | | |
|---|---|---|---|---|
| 9,247,675 B2* | 1/2016 | Higuchi | ................... | B60L 15/20 |
| 10,483,840 B2* | 11/2019 | You | ..................... | H05K 7/20327 |
| 2009/0251850 A1* | 10/2009 | Morales | .................. | E05C 19/06 |
| | | | | 361/600 |
| 2009/0284930 A1* | 11/2009 | Ice | ..................... | H05K 7/20418 |
| | | | | 361/715 |
| 2013/0342014 A1* | 12/2013 | Johannessen | ......... | H02M 7/003 |
| | | | | 363/95 |
| 2019/0252971 A1* | 8/2019 | Kim | ......................... | H02M 1/32 |

(Continued)

FOREIGN PATENT DOCUMENTS

| | | | |
|---|---|---|---|
| JP | 2021158847 A | * | 10/2021 |
| KR | 10-2013-0013339 A | | 2/2013 |
| KR | 10-2021-0099813 A | | 8/2021 |

OTHER PUBLICATIONS

Kuwabara Takashi, "Power Conversion Device", Oct. 7, 2021, Fuji Electric Co LTD, Entire Document (Translation of JP 2021158847). (Year: 2021).*

*Primary Examiner* — Stephen S Sul

(74) *Attorney, Agent, or Firm* — Morgan Lewis & Bockius LLP

(57) ABSTRACT

A power conversion apparatus may include a main converter including a main housing and at least one transformer disposed in an interior of the main housing, a sub-converter including a sub-housing coupled to an upper portion of the main housing and a voltage boost assembly disposed in an interior of the sub-housing, a lower cooling unit provided in a lower portion of the main housing to support the at least one transformer, and an upper cooling unit provided in a lower portion of the sub-housing to support the voltage boost assembly.

16 Claims, 10 Drawing Sheets

(56) References Cited

U.S. PATENT DOCUMENTS

| | | | | |
|---|---|---|---|---|
| 2020/0352059 A1* | 11/2020 | Kim | ................... | H05K 7/20872 |
| 2022/0142011 A1* | 5/2022 | Doo | ................... | H05K 7/20927 |
| | | | | 361/697 |
| 2022/0377948 A1* | 11/2022 | Kuwahara | .......... | H05K 7/20927 |
| 2023/0104002 A1* | 4/2023 | Azuma | .............. | H05K 7/20263 |
| | | | | 361/699 |

* cited by examiner

POWER CONVERSION APPARATUS

CROSS-REFERENCE TO RELATED APPLICATION

The present application claims priority to Korean Patent Application No. 10-2022-0169721 filed on Dec. 7, 2022, the entire contents of which is incorporated herein for all purposes by this reference.

BACKGROUND OF THE PRESENT DISCLOSURE

Field of the Present Disclosure

The present disclosure relates to a power conversion apparatus of a vehicle. More particularly, the present disclosure relates to a cooling structure of a power conversion apparatus that includes a DC/DC converter.

DESCRIPTION OF RELATED ART

Recently, the development of environment-friendly vehicles has been steadily progressing due to environmental pollution problems and efforts to develop alternative energy. Examples of environment-friendly vehicles include hybrid vehicles, electric vehicles, hybrid electric vehicles, and hydrogen-powered vehicles (frequently referred to as "hydrogen electric vehicles" by those skilled in the art).

Such an environment-friendly vehicle includes a driving motor, a high-voltage battery, a low-voltage battery, and a power conversion apparatus.

The high-voltage battery supplies power to the drive motor. The low-voltage battery supplies power to the vehicle's electrical and/or electronic equipments. Furthermore, the power conversion apparatus may include a converter and an inverter.

Here, the converter may be a Low-Side DC/DC Converter (LDC) that receives power from a high-voltage battery and converts the voltage to be supply power to the low-voltage battery.

The converter has a transformer for isolation between high voltage and low voltage. The transformer is provided in an interior of the converter housing. Such a transformer includes a bobbin on which a primary coil and a secondary coil are wound, and a core surrounding the bobbin.

Because such a transformer changes the form of electrical energy, heat due to electrical energy loss is generated. The performance of a transformer may be governed by such heat. Accordingly, the converter includes a water-cooled cooling unit having relatively high cooling efficiency to dissipate heat generated in the transformer.

The water-cooled cooling unit for instance may flow coolant through a coolant passage at an internal bottom side of a converter housing supporting a lower portion of the transformer, and may dissipate heat generated in the transformer to the outside of the converter housing.

On the other hand, the heat of the transformer is generated from a primary coil, a secondary coil, and a core as a whole. However, since the conventional power conversion apparatus cools only the lower part of the transformer through a water-cooled cooling unit, the upper part of the transformer may be excessively heated.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power conversion apparatus capable of for effectively dissipating generated at a converter portion.

A power conversion apparatus may include a main converter including a main housing and at least one transformer disposed in an interior of the main housing, a sub-converter including a sub-housing coupled to an upper portion of the main housing and a voltage boost assembly disposed in an interior of the sub-housing, a lower cooling unit provided in a lower portion of the main housing to support the at least one transformer, and an upper cooling unit provided in a lower portion of the sub-housing to support the voltage boost assembly.

The main housing may include a main case including an open upper end portion and a main cover coupled to the open upper portion of the main case.

The sub-housing may include a sub-case coupled to the main cover and including an open upper end portion and a sub-cover coupled to the open upper portion of the sub-case.

A power conversion apparatus may further include a first heat dissipation pad disposed in an upper portion of the at least one transformer.

A power conversion apparatus may further include a second heat dissipation pad disposed between the upper portion of the main housing and the lower portion of the sub-housing.

The first heat dissipation pad may be disposed between a lower surface of the main cover and an upper surface of the at least one transformer.

The second heat dissipation pad may be disposed between an upper surface of the main cover and a lower portion of the sub-case.

The second heat dissipation pad may be disposed to overlap the upper cooling unit.

The lower cooling unit may include a lower coolant passage formed on an external bottom surface of a main case, and a lower cooling plate coupled to the external bottom surface of the main case.

The main case may include a first coolant inlet and a first coolant outlet, respectively connected to a first coolant flow passage formed between the lower coolant passage and the lower cooling plate.

A plurality of first cooling pins may be formed in the lower coolant passage.

The upper cooling unit may include an upper coolant passage formed on the external bottom surface of a sub-case, and an upper cooling plate coupled to the external bottom surface of the sub-case.

The sub-case may include a second coolant inlet and a second coolant outlet, respectively connected to a second coolant flow passage formed between the upper coolant passage and the upper cooling plate.

A plurality of second cooling pins are formed in the upper coolant passage.

The main cover may include a plurality of coupling bosses formed on an upper surface, and The sub-case may include a plurality of coupling ribs engaged with the plurality of coupling bosses.

The main converter may be an insulated full-bridge converter.

The sub-converter may be a non-insulated boost converter.

According to an exemplary embodiment of the present disclosure, the at least one transformer may be doubly cooled through the lower cooling unit and the upper cooling unit disposed at the lower side and the upper side of the at least one transformer.

Other effects which may be obtained or are predicted by an exemplary embodiment will be explicitly or implicitly described in a detailed description of the present disclosure. That is, various effects that are predicted according to an exemplary embodiment will be described in the following detailed description.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
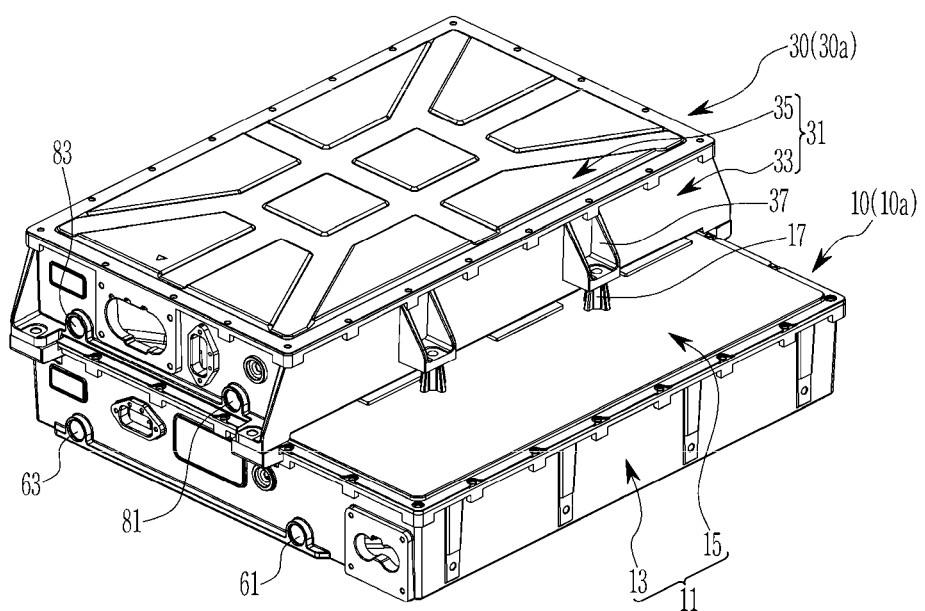
FIG. 1 is a perspective view showing a power conversion apparatus according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to a same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

The terminology used herein is for describing various exemplary embodiments only and is not intended to be limiting of the present disclosure. As used herein, the singular forms are intended to include the plural forms as well, unless the context clearly indicates otherwise.

As used herein, the term "comprises" and/or "comprising" refers to the presence of specified features, integers, steps, acts, elements and/or components, but it should also be understood that it does not exclude a presence or an addition of one or more other features, integers, steps, acts, components, and/or groups thereof. As used herein, the term "and/or" includes any one or all combinations of one or more related items.

The term "coupled" denotes a physical relationship between two components in which components are directly connected to each other or indirectly through one or more intermediary components.

It is understood that the term "vehicle," "vehicular," "car," or other similar term as used herein is inclusive of, in general, passenger automobiles including sports cars, sports utility vehicles (SUV), buses, trucks, various commercial vehicles, and inclusive of hybrid vehicles, electric vehicles, hybrid electric vehicles, hydrogen-powered vehicles, purpose built vehicles (PBV), and other alternative fuel vehicles (e.g., fuels derived from resources other than petroleum).

Hereinafter, an example of the present disclosure is described in detail with reference to the accompanying drawing.

Figure 2:
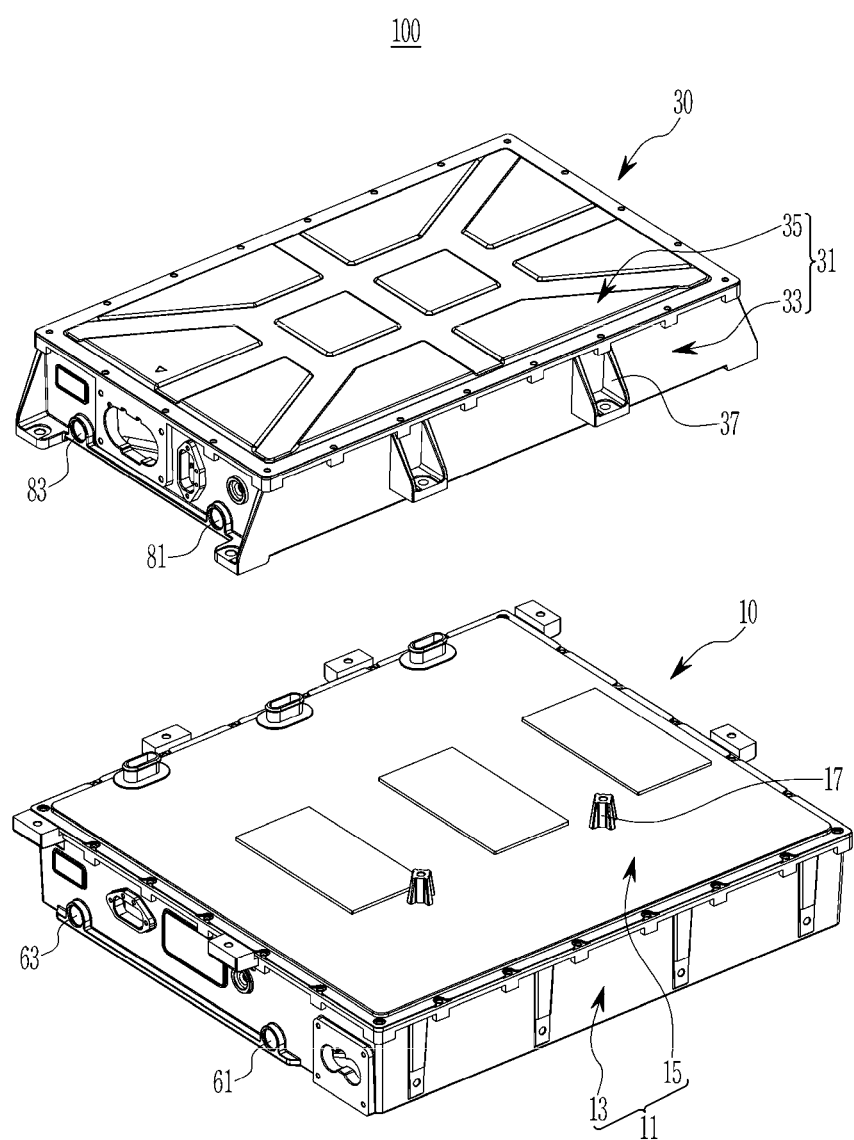
FIG. 2, FIG. 3 and FIG. 4 are an exploded perspective view showing a power conversion apparatus according to an exemplary embodiment of the present disclosure.
Figure 3:
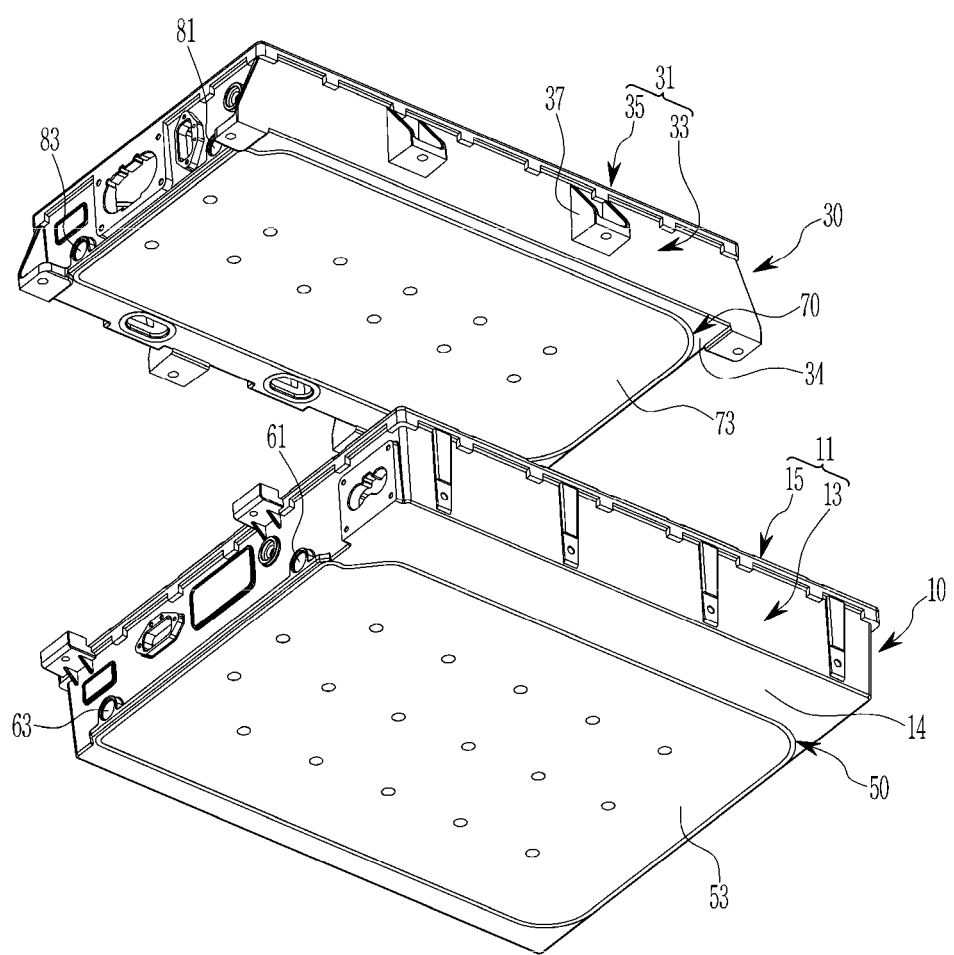
Figure 4:
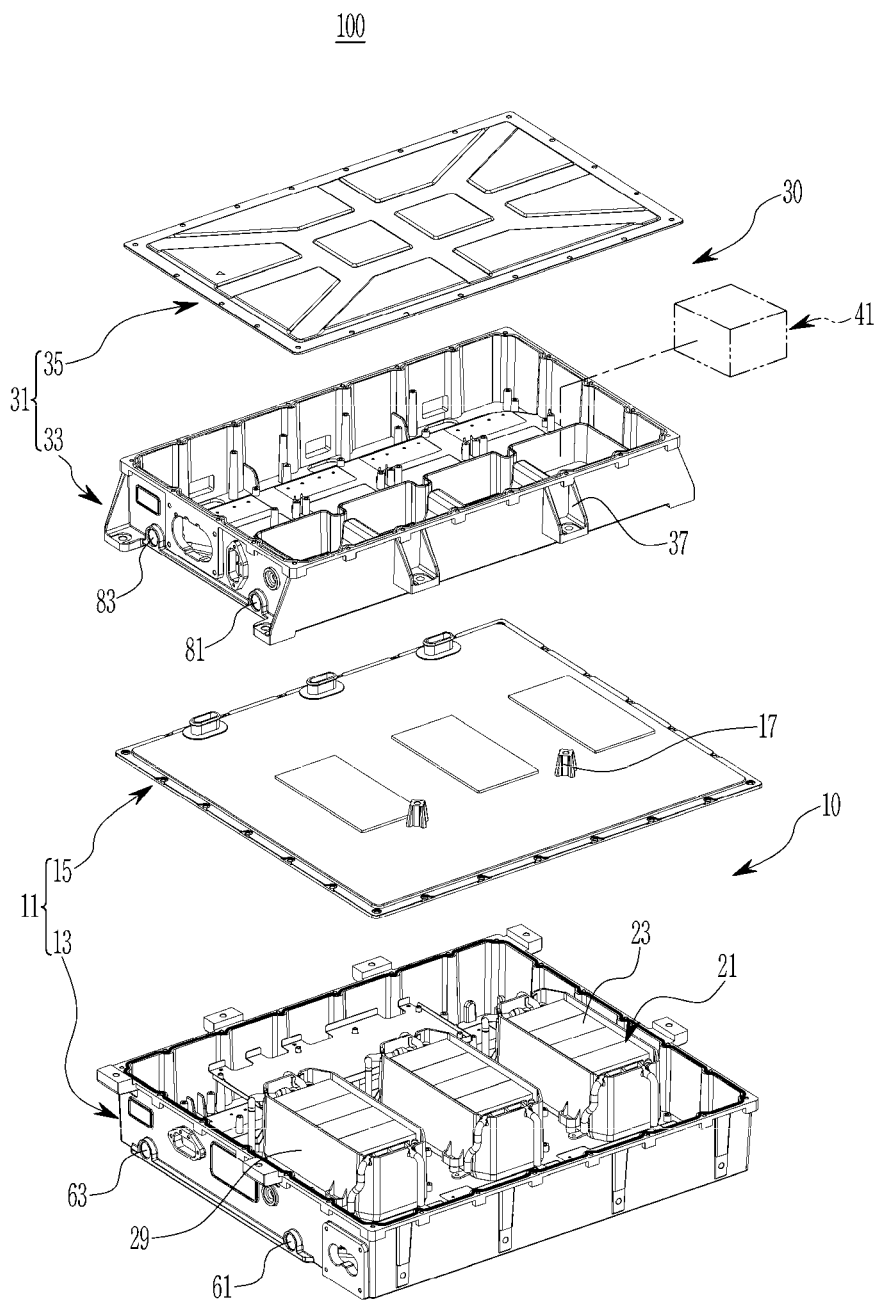

FIG. 1 is a perspective view showing a power conversion apparatus according to an exemplary embodiment of the present disclosure. FIG. 2, FIG. 3 and FIG. 4 are an exploded perspective view showing a power conversion apparatus according to an exemplary embodiment of the present disclosure.

Referring to FIG. 1, FIG. 2, FIG. 3 and FIG. 4, a power conversion apparatus 100 according to various exemplary embodiments of the present disclosure may be applied to an electrical system of an environment-friendly vehicle.

Here, the environment-friendly vehicle may include a hybrid vehicle, an electric vehicle, a hydrogen-powered vehicle (frequently called a 'hydrogen electric vehicle' by those skilled in the art), and purpose-built mobility vehicle (PBV vehicle) based on the electric vehicle.

However, the scope of the present disclosure is not limited to the electrical system of the environment-friendly vehicle, and may be applied to the electrical system of various kinds and fields.

An example of the power conversion apparatus 100 according to various exemplary embodiments of the present disclosure may be a Low-Side DC/DC Converter (LDC) to convert an input voltage to a preset output voltage to supply electric power to a drive motor and electrical components provided in the vehicle.

In an exemplary embodiment of the present disclosure, a vertical direction with reference to the drawing may be taken as a reference direction in description of the constituent elements.

Furthermore, in the present specification, "upper end portion", "upper portion", "upper end", or "upper surface" of a component indicates end portion, portion, end, or surface of the component which is relatively positioned higher in the drawing, and "lower end portion", "lower portion", "lower end", or "lower surface" of a component indicates end portion, portion, end, or surface of the component which is relatively positioned lower in the drawing.

Furthermore, in the present specification, "end" (for example, one end, another end, or the like) of a component indicates an end of the component in any direction, and "end portion" (for example, one end portion, another end portion, or the like) of a component indicates a certain part of the component including the end.

Meanwhile, in the power conversion apparatus 100 according to an exemplary embodiment of the present disclosure, heat due to the electrical energy loss in converting the input voltage into the preset output voltage may be generated.

Accordingly, the power conversion apparatus 100 according to an exemplary embodiment of the present disclosure is structured so that the heat generated by converter components as a whole may be effectively dissipated.

For such a purpose, the power conversion apparatus 100 according to an exemplary embodiment includes, a main converter 10, a sub-converter 30, a lower cooling unit 50, and an upper cooling unit 70.

Referring to FIG. 1, FIG. 2, FIG. 3 and FIG. 4, in an exemplary embodiment of the present disclosure, the main converter 10 may include an isolated full-bridge converter 10a, which is known to those skilled in the art. The isolated full-bridge converter 10a is also called a Phase Shift Full Bridge (PSFB) converter in the field, and is widely used due to the capability of Zero Voltage Switching (ZVS).

Figure 5:
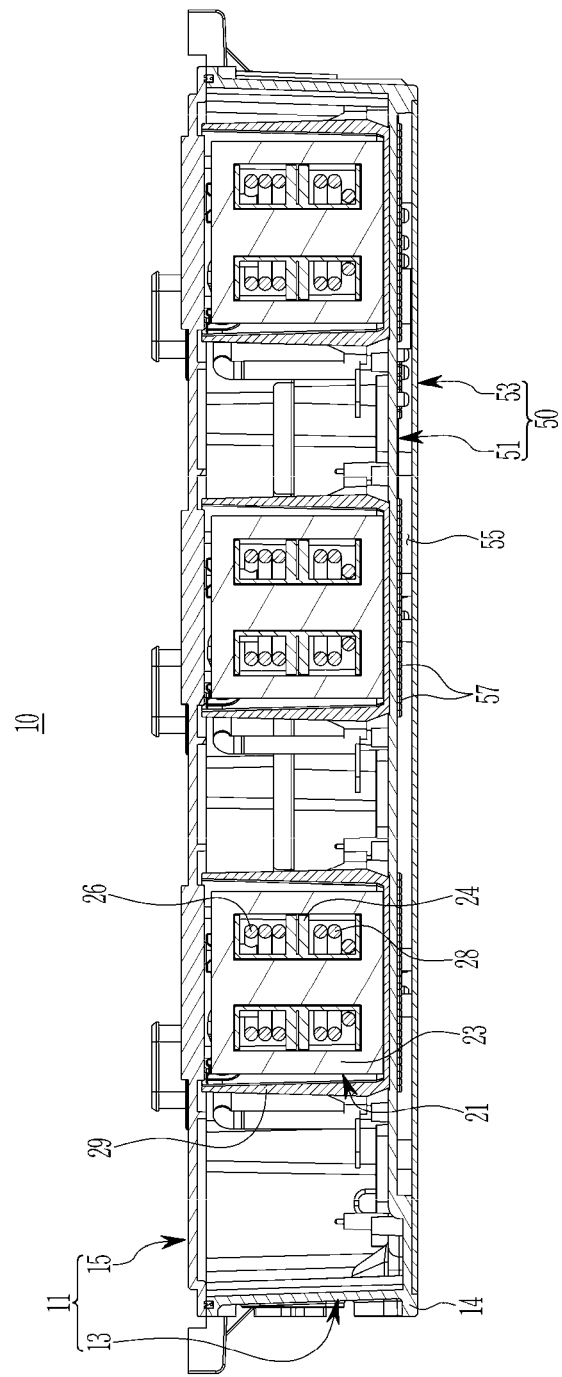
FIG. 5 is a cross-sectional view showing a main converter applied to a power conversion apparatus according to an exemplary embodiment of the present disclosure.

FIG. 5 is a cross-sectional view showing a main converter applied to a power conversion apparatus according to an exemplary embodiment of the present disclosure.

Referring to FIG. 1 to FIG. 5, the main converter 10 according to various exemplary embodiments of the present disclosure may include a main housing 11 and at least one transformer 21.

The main housing 11 includes a main case 13 and a main cover 15. The main case 13 is provided in the shape including an open upper end portion. The main case 13 includes a bottom surface formed in a lower portion and side walls extending upwards from edge portions of the bottom surface. In an exemplary embodiment of the present disclosure, the main case 13 may be formed of an aluminum material.

The main cover 15 is coupled to an upper portion of the main case 13 to close an upper end portion of the main case 13. In an exemplary embodiment of the present disclosure, the main cover 15 may be formed of an aluminum material.

Furthermore, the main cover 15 includes a plurality of coupling bosses 17 formed on an upper surface thereof.

Furthermore, the at least one transformer 21 is provided in an interior of the main housing 11. The at least one transformer 21 is configured to determine the output voltage while the high voltage and the low voltage being separated.

As shown in FIG. 5, the at least one transformer 21 includes a core 23 made of a ferrite steel material, a bobbin 24 disposed in an interior of the core 23, and a primary coil 26 and a secondary coil 28 wound around the bobbin 24.

Here, the primary coil 26 and the secondary coil 28 wound around the bobbin 24 may be molded by a silicone molding liquid injected into the core 23. The configuration of at least one transformer 21 is well known to those skilled in the art, is not described in further detail.

The at least one transformer 21 may be fixed to an internal bottom surface of the main housing 11. Furthermore, the at least one transformer 21 may be disposed in an interior of an internal case 29 fixed to the internal bottom surface of the main housing 11. The internal case 29 may be made of an aluminum material, and provided in the shape including an open upper end portion and an open lower end portion. Furthermore, the at least one transformer 21 may generate heat due to loss of electrical energy.

Referring to FIG. 1, FIG. 2, FIG. 3 and FIG. 4, in an exemplary embodiment of the present disclosure, the sub-converter 30 may include a non-isolated boost converter 30a known to those skilled in the art. The non-isolated boost converter 30a is also called a 2-phase interleaved boost converter in the field. The non-isolated boost converter 30a is configured to boost an input voltage to a voltage higher than the input voltage.

The sub-converter 30 may be electrically connected to the main converter 10, and coupled to an upper portion of the main housing 11 of the main converter 10.

Figure 6:
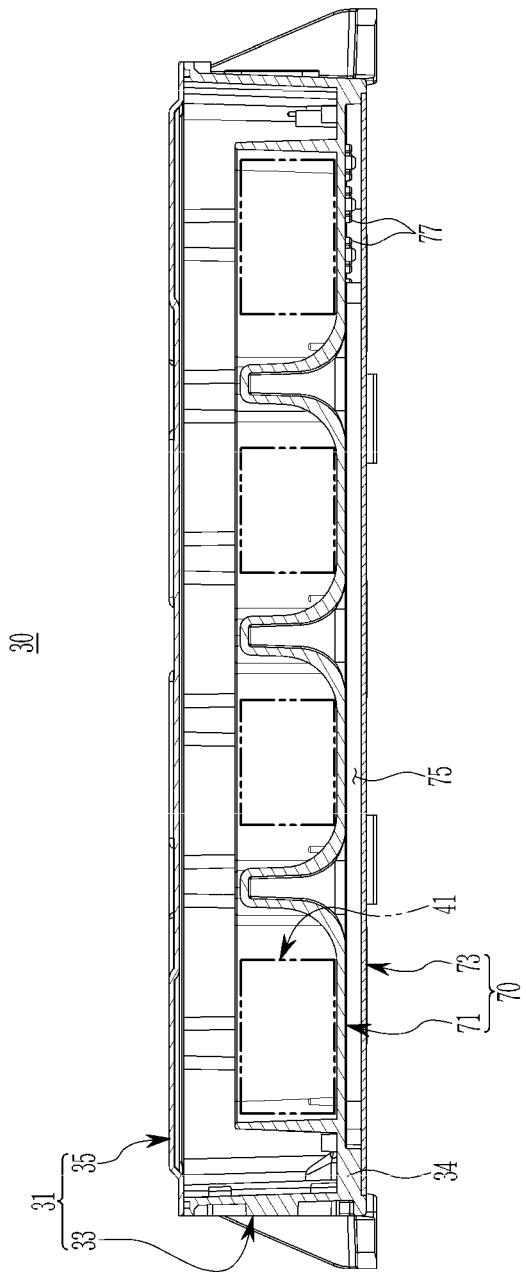
FIG. 6 is a cross-sectional view showing a sub-converter applied to a power conversion apparatus according to an exemplary embodiment of the present disclosure.

FIG. 6 is a cross-sectional view showing a sub-converter applied to a power conversion apparatus according to an exemplary embodiment of the present disclosure.

Referring to FIG. 1 to FIG. 6, the sub-converter 30 according to an exemplary embodiment of the present disclosure includes a sub-housing 31 and a voltage boost assembly 41.

The sub-housing 31 includes a sub-case 33 and a sub-cover 35. The sub-case 33 is provided in the shape including an open upper end portion. The sub-case 33 includes a bottom surface formed in a lower portion and side walls extending upwards from edge portions of the bottom surface. In an exemplary embodiment of the present disclosure, the sub-case 33 may be formed of an aluminum material.

Here, the sub-case 33 may be coupled to an upper portion of the main housing 11, more specifically, the main cover 15. For the present purpose, the sub-case 33 includes a plurality of coupling ribs 37.

The plurality of coupling ribs 37 may be formed on both side walls of the sub-case 33. The plurality of coupling ribs 37 may be engaged with the plurality of coupling bosses 17 of the main cover 15 mentioned above. The plurality of coupling ribs 37 and the plurality of coupling bosses 17 may be coupled to each other by fastening members, e.g., combinations of bolts and nuts.

The sub-cover 35 is coupled to an upper portion of the sub-case 33 to close an upper end portion of the sub-case 33. In an exemplary embodiment of the present disclosure, the sub-cover 35 may be formed of an aluminum material.

Furthermore, the voltage boost assembly 41 is provided in an interior of the sub-housing 31. The voltage boost assembly 41 may include a voltage conversion element that boosts an input voltage to a voltage higher than the input voltage.

Here, the voltage boost assembly 41 may include diodes, switches, and capacitors as the voltage conversion element. The configuration of the voltage boost assembly 41 is known to those skilled in the art, and is not described in further detail.

Furthermore, the voltage boost assembly 41 may generate heat due to loss of electrical energy. The voltage boost assembly 41 may be heated to a temperature relatively lower than the heated temperature of the at least one transformer 21.

Referring to FIG. 1, FIG. 2, FIG. 3 and FIG. 4, in an exemplary embodiment of the present disclosure, the lower cooling unit 50 is configured to dissipate, in a water-cooled scheme by use of the coolant, the heat generated at the at least one transformer 21 of the main converter 10.

Furthermore, the lower cooling unit 50 is configured to support a lower portion of the at least one transformer 21 in the interior of the main housing 11. The lower cooling unit 50 may be provided in a lower portion of the main housing 11.

Figure 7:
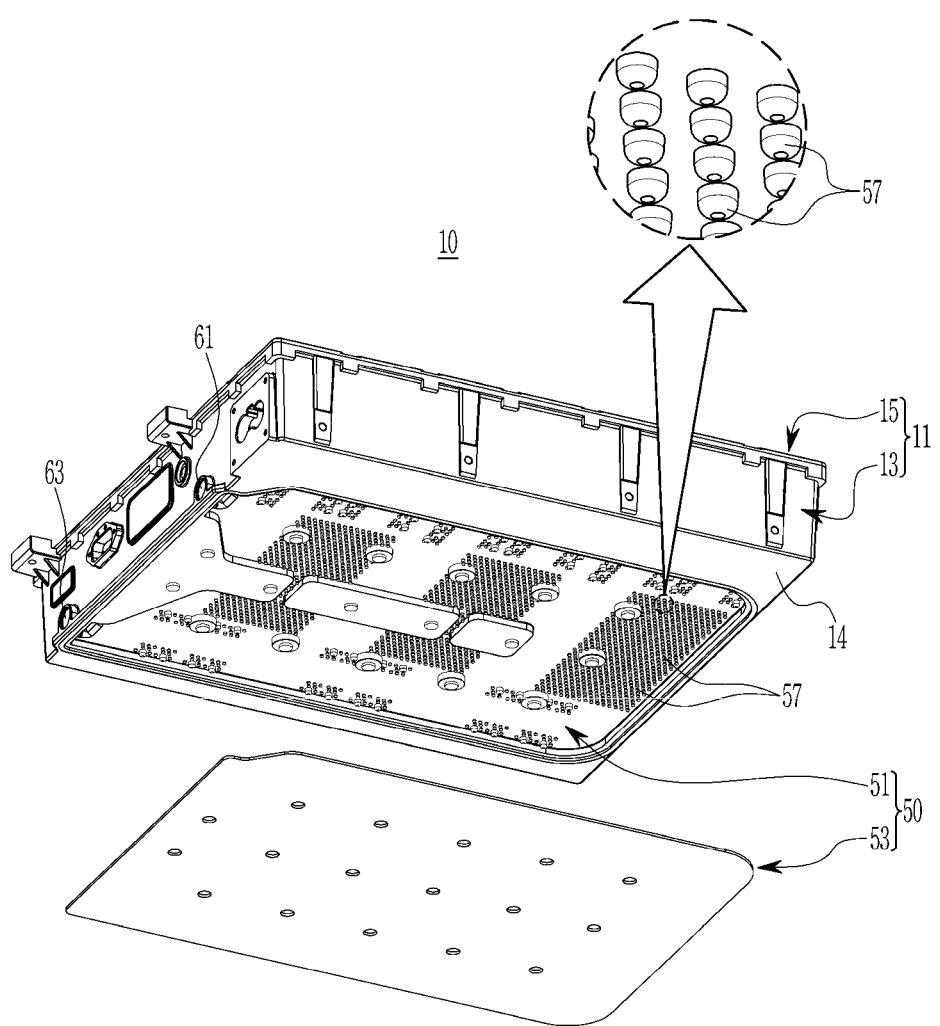
FIG. 7 is a drawing showing a lower cooling unit applied to a power conversion apparatus according to an exemplary embodiment of the present disclosure.

FIG. 7 is a drawing showing a lower cooling unit applied to a power conversion apparatus according to an exemplary embodiment of the present disclosure.

Referring to FIG. 5 and FIG. 7, the lower cooling unit 50 according to an exemplary embodiment of the present disclosure includes a lower coolant passage 51 and a lower cooling plate 53.

The lower coolant passage 51 may be formed on an external bottom surface 14 of the main case 13 of the main housing 11. The lower coolant passage 51 is configured to flow the coolant along a predetermined flow passage.

The lower cooling plate 53 may be coupled to the external bottom surface 14 of the main case 13. In an exemplary embodiment of the present disclosure, the lower cooling plate 53 may be formed of an aluminum material.

Because the lower cooling plate 53 is coupled to the external bottom surface 14 of the main case 13, a first coolant flow passage 55 may be formed between the lower coolant passage 51 and the lower cooling plate 53.

Furthermore, a plurality of first cooling pins 57 are formed in the lower coolant passage 51. The plurality of first cooling pins 57 may be formed in the shape of protrusions protruding from the external bottom surface 14 of the main case 13.

The plurality of first cooling pins 57 contributes to increase the contact area between the main case 13 and the coolant flowing along the first coolant flow passage 55. The plurality of first cooling pins 57 contributes to increase heat-exchange efficiency between the coolant and the at least one transformer 21.

Furthermore, the main case 13 includes a first coolant inlet 61 and a first coolant outlet 63 respectively connected to the first coolant flow passage 55. The coolant may be introduced through the first coolant inlet 61, may flow through the first coolant flow passage 55, and may be discharged through the first coolant outlet 63.

Referring to FIG. 1, FIG. 2, FIG. 3 and FIG. 4, in an exemplary embodiment of the present disclosure, the upper cooling unit 70 is configured to dissipate, in a water-cooled scheme by use of the coolant, the heat generated at the voltage boost assembly 41 of the sub-converter 30 and the heat generated at the at least one transformer 21 of the main converter 10.

Furthermore, the upper cooling unit 70 is configured to support a lower portion of the voltage boost assembly 41 in the interior of the sub-housing 31. The upper cooling unit 70 may be provided in a lower portion of the sub-housing 31 coupled to the upper portion of the main housing 11.

Figure 8:
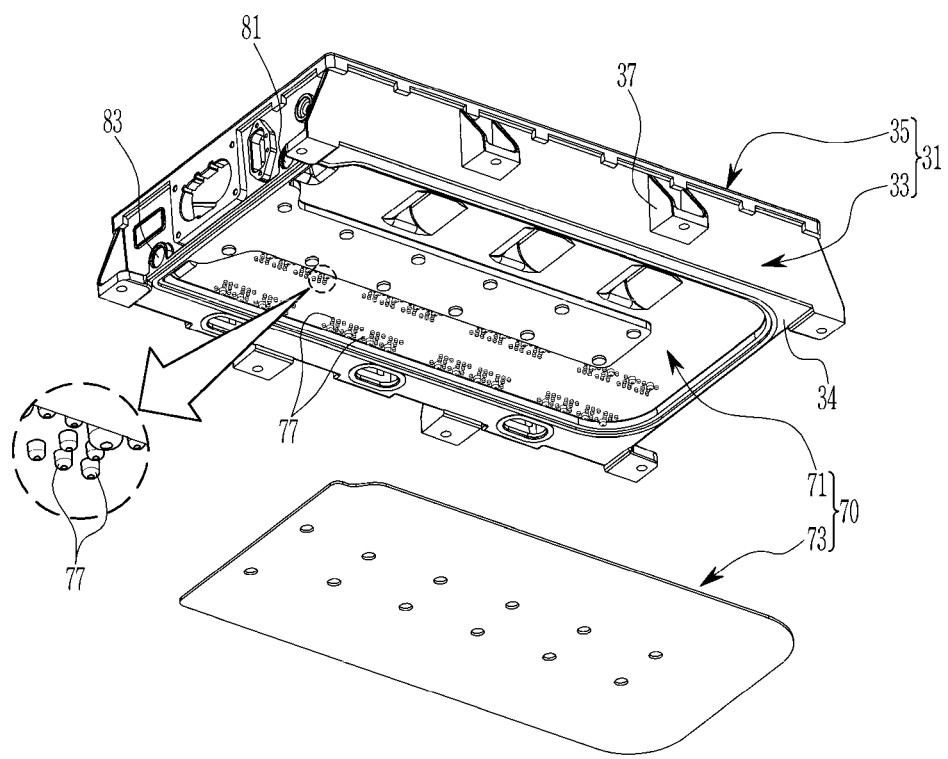
FIG. 8 is a drawing showing an upper cooling unit applied to a power conversion apparatus according to an exemplary embodiment of the present disclosure.

FIG. 8 is a drawing showing an upper cooling unit applied to a power conversion apparatus according to an exemplary embodiment of the present disclosure.

Referring to FIG. 6 and FIG. 8, the upper cooling unit 70 according to an exemplary embodiment of the present disclosure includes an upper coolant passage 71 and an upper cooling plate 73.

The upper coolant passage 71 may be formed on an external bottom surface 34 of the sub-case 33 of the sub-housing 31. The upper coolant passage 71 is configured to flow the coolant along a predetermined flow passage.

The upper cooling plate 73 may be coupled to the external bottom surface 34 of the sub-case 33. In an exemplary embodiment of the present disclosure, the upper cooling plate 73 may be formed of an aluminum material.

Because the upper cooling plate 73 is coupled to the external bottom surface 34 of the sub-case 33, a second coolant flow passage 75 may be formed between the upper coolant passage 71 and the upper cooling plate 73.

Furthermore, a plurality of second cooling pins 77 are formed in the upper coolant passage 71. The plurality of second cooling pins 77 may be formed in the shape of protrusions protruding from the external bottom surface 34 of the sub-case 33.

The plurality of second cooling pins 77 contributes to increase the contact area between the sub-case 33 and the coolant flowing along the second coolant flow passage 75. The plurality of second cooling pins 77 contributes to increase heat-exchange between the coolant and the voltage boost assembly 41 and the at least one transformer 21.

Furthermore, the sub-case 33 includes a second coolant inlet 81 and a second coolant outlet 83 respectively connected to the second coolant flow passage 75. The coolant may be introduced through the second coolant inlet 81, may flow through the second coolant flow passage 75, and may be discharged through the second coolant outlet 83.

Figure 9:
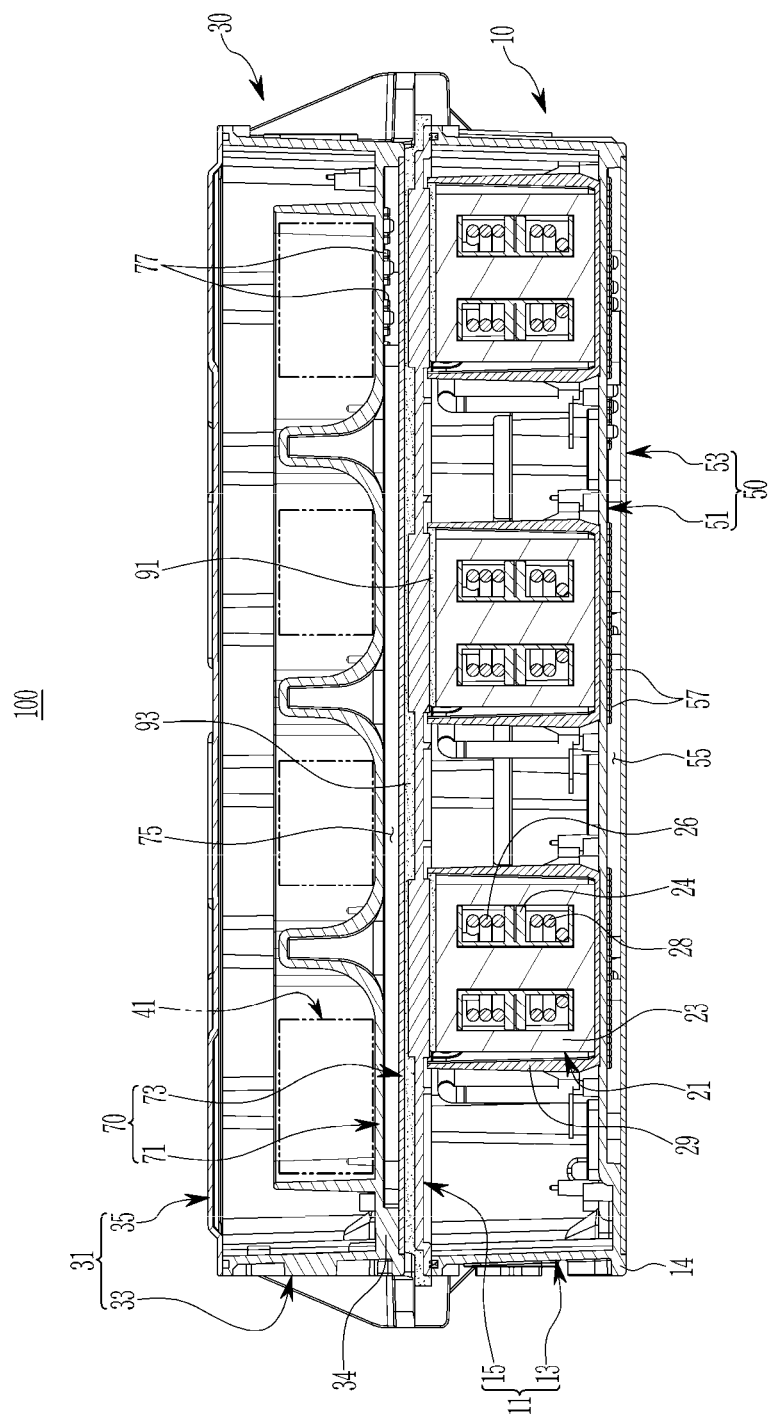
FIG. 9 is a cross-sectional view showing a power conversion apparatus according to an exemplary embodiment of the present disclosure.

FIG. 9 is a cross-sectional view showing a power conversion apparatus according to an exemplary embodiment of the present disclosure.

Referring to FIG. 9, the power conversion apparatus 100 according to an exemplary embodiment further includes a first heat dissipation pad 91 and a second heat dissipation pad 93.

In an exemplary embodiment of the present disclosure, the first heat dissipation pad 91 is disposed in an upper portion of the at least one transformer 21 in the main converter 10. The first heat dissipation pad 91 may be disposed between a lower surface of the main cover 15 of the main housing 11 and an upper surface of the at least one transformer 21.

Here, the first heat dissipation pad 91 may be attached to the lower surface of the main cover 15, and may be in tight contact with the upper surface of the at least one transformer 21. Furthermore, the first heat dissipation pad 91 may be attached to the upper surface of the at least one transformer 21, and may be in tight contact with the lower surface of the main cover 15.

The first heat dissipation pad 91 may transfer the heat generated at the at least one transformer 21 of the main converter 10 to the upper cooling unit 70 of the sub-converter 30 through the main cover 15.

In an exemplary embodiment of the present disclosure, the second heat dissipation pad 93 is disposed in the upper portion of the main housing 11 of the main converter 10 and the lower portion of the sub-housing 31 of the sub-converter 30. The second heat dissipation pad 93 may be disposed between an upper surface of the main cover 15 of the main housing 11 and a lower portion of the sub-case 33 of the sub-housing 31.

Here, the second heat dissipation pad 93 may be disposed to overlap the upper cooling unit 70. The second heat dissipation pad 93 may be attached to the upper surface of the main cover 15, and may be in tight contact with a lower surface of the upper cooling plate 73 of the upper cooling unit 70. Furthermore, the second heat dissipation pad 93 may be attached to the lower surface of the upper cooling plate 73, and may be in tight contact with the upper surface of the main cover 15.

The second heat dissipation pad 93 may transfer the heat generated at the at least one transformer 21 of the main converter 10 to the upper cooling unit 70 through the first heat dissipation pad 91 and the main cover 15.

Hereinafter, structure and operation of the power conversion apparatus 100 according to an exemplary embodiment configured as described above is described in detail with reference to FIG. 1 to FIG. 9.

Figure 10:
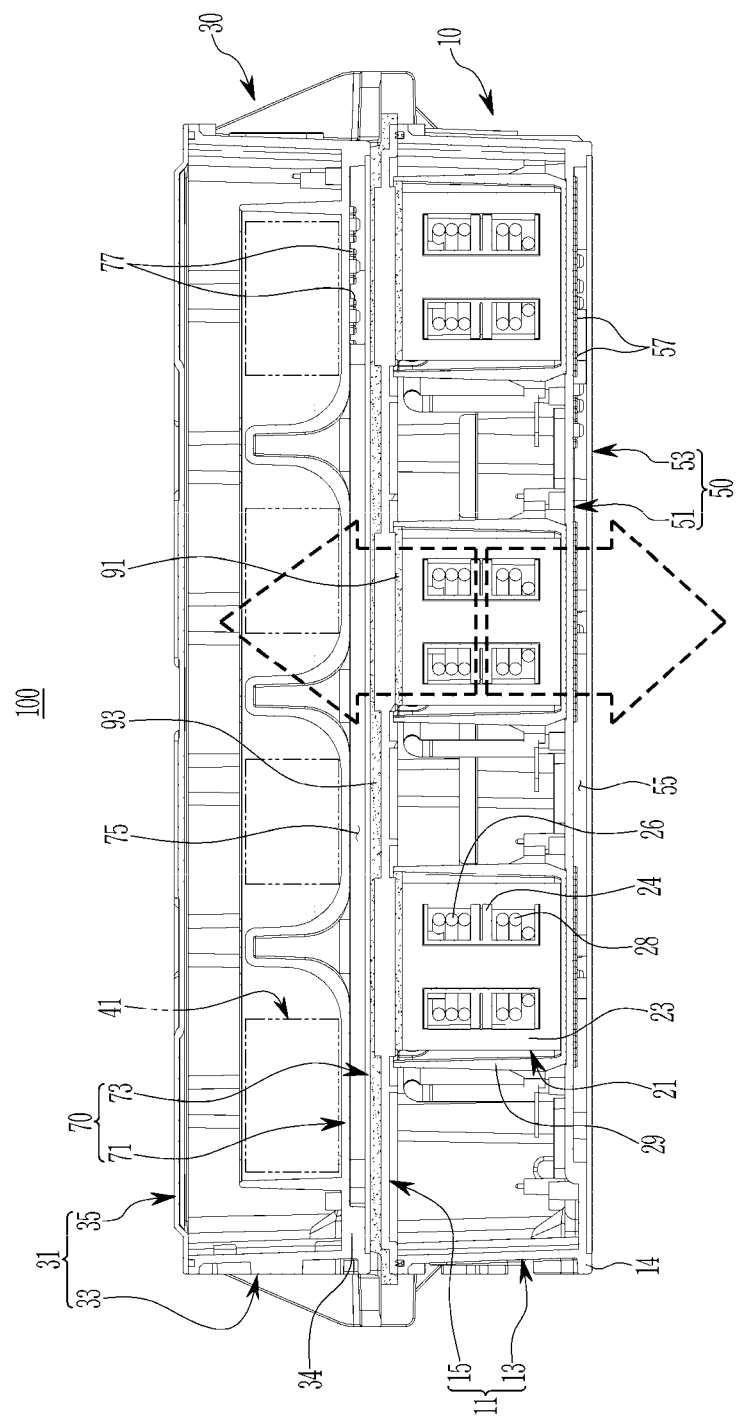
FIG. 10 is a drawing showing an operation of a power conversion apparatus according to an exemplary embodiment of the present disclosure.

FIG. 10 is a drawing showing an operation of a power conversion apparatus according to an exemplary embodiment of the present disclosure.

First, referring to FIG. 1 to FIG. 9, in an exemplary embodiment of the present disclosure, the main converter 10 including the at least one transformer 21 mounted in the interior of the main housing 11 is provided.

Here, the lower cooling unit 50 is provided in the lower portion of the main housing 11. The lower cooling unit 50 supports the lower portion of the at least one transformer 21 in an internal side of the main housing 11. Furthermore, the first heat dissipation pad 91 is disposed between the lower surface of the main cover 15 of the main housing 11 and the upper surface of the at least one transformer 21.

Furthermore, in an exemplary embodiment of the present disclosure, the sub-converter 30 including the voltage boost assembly 41 mounted in the interior of the sub-housing 31.

Here, the upper cooling unit 70 is provided in the lower portion of the sub-housing 31. The upper cooling unit 70 supports the lower portion of the voltage boost assembly 41 in an internal side of the sub-housing 31.

In such a state, the main converter 10 and the sub-converter 30 are coupled to each other in the vertical direction, and electrically connected to each other. At the instant time, the sub-converter 30 is coupled to the upper portion of the main housing 11 of the main converter 10.

In more detail, the plurality of coupling ribs 37 provided on the sub-case 33 of the sub-housing 31 is engaged with the plurality of coupling bosses 17 provided on the main cover 15 of the main housing 11, through fastening members. Accordingly, the main housing 11 and the sub-housing 31 may be coupled to each other in the vertical direction thereof.

Here, the second heat dissipation pad 93 is disposed between the upper surface of the main cover 15 of the main housing 11 and the lower portion of the sub-case 33 of the sub-housing 31. That is, the second heat dissipation pad 93 is disposed between the upper surface of the main cover 15 and the lower surface of the upper cooling plate 73 of the upper cooling unit 70

The power conversion apparatus 100 according to an exemplary embodiment converts the input voltage to the preset output voltage by the main converter 10 and the sub-converter 30.

Furthermore, the power conversion apparatus 100 according to an exemplary embodiment of the present disclosure is configured in the 2-stage structure of the main converter 10 and the sub-converter 30, and thus the range of the input voltage and the output voltage may be increased.

Meanwhile, during the process, the at least one transformer 21 of the main converter 10 and the voltage boost assembly 41 of the sub-converter 30 may generate heat due to loss of electrical energy. At the instant time, the at least one transformer 21 is heated to temperature relatively higher than the heated temperature of the voltage boost assembly 41.

Accordingly, according to the power conversion apparatus 100 according to an exemplary embodiment of the present disclosure, as shown in FIG. 10, the coolant is introduced through the first coolant inlet 61 of the main case 13, flows along the first coolant flow passage 55 of the lower cooling unit 50, and discharged through the first coolant outlet 63.

Therefore, the at least one transformer 21 performs heat-exchange with the coolant flowing along the first coolant flow passage 55, and dissipates the heat generated in the lower portion (refer to the dotted line arrow in FIG. 10).

Furthermore, the coolant is introduced through the second coolant inlet 81 of the sub-case 33, flows along the second coolant flow passage 75 of the upper cooling unit 70, and discharged through the second coolant outlet 83.

Therefore, the voltage boost assembly 41 exchanges heat with the coolant flowing along the second coolant flow passage 75, and dissipates the heat.

During the present process, the heat generated at the upper portion of the at least one transformer 21 is transferred to the upper cooling unit 70 through the first heat dissipation pad 91, the main cover 15, and the second heat dissipation pad 93.

Therefore, the at least one transformer 21 performs heat-exchange with the coolant flowing along the second coolant flow passage 75 of the upper cooling unit 70, and dissipates the heat generated in the upper portion (refer to the dotted line arrow in FIG. 10).

According to the power conversion apparatus 100 according to an exemplary embodiment of the present disclosure, the heat generated at the at least one transformer 21 of the main converter 10 and the voltage boost assembly 41 of the sub-converter 30 may be dissipated by the lower cooling unit 50, the upper cooling unit 70 of the sub-converter 30, the first heat dissipation pad 91, and the second heat dissipation pad 93.

Furthermore, according to the power conversion apparatus 100 according to an exemplary embodiment of the present disclosure, the heat generated at the lower and upper portions of the at least one transformer 21 may be dissipated by the lower cooling unit 50, the upper cooling unit 70 of the sub-converter 30, the first heat dissipation pad 91, and the second heat dissipation pad 93.

Therefore, according to the power conversion apparatus 100 according to an exemplary embodiment of the present disclosure, the at least one transformer 21 may be doubly cooled through the lower cooling unit 50 and the upper cooling unit 70 disposed at the lower side and the upper side of the at least one transformer 21.

Accordingly, according to the power conversion apparatus 100 according to an exemplary embodiment of the present disclosure, cooling performance of the at least one transformer 21 provided in the main converter 10 may be improved.

Accordingly, according to the power conversion apparatus 100 according to an exemplary embodiment of the present disclosure, the at least one transformer 21 may be reduced in size, and material cost for the at least one transformer 21 may be decreased.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power conversion apparatus, comprising:
   a main converter including a main housing and at least one transformer disposed in an interior of the main housing;
   a sub-converter including a sub-housing coupled to an upper portion of the main housing and a voltage boost assembly disposed in an interior of the sub-housing;
   a lower cooling unit provided in a lower portion of the main housing to support the at least one transformer; and
   an upper cooling unit provided in a lower portion of the sub-housing to support the voltage boost assembly,
   wherein the main housing includes a main case,
   wherein the lower cooling unit includes:
      a lower coolant passage formed on an external bottom surface of the main case; and
      a lower cooling plate coupled to the external bottom surface of the main case,
   wherein the sub-housing includes a sub-case, and
   wherein the upper cooling unit includes:
      an upper coolant passage formed on an external bottom surface of the sub-case; and
      an upper cooling plate coupled to the external bottom surface of the sub-case.

2. The power conversion apparatus of claim 1,
   wherein the main housing includes a main case including an open upper end portion and a main cover coupled to the open upper portion of the main case, and
   wherein the sub-housing includes the sub-case coupled to the main cover and including an open upper end portion and a sub-cover coupled to the open upper portion of the sub-case.

3. The power conversion apparatus of claim 2, further including a first heat dissipation pad disposed in an upper portion of the at least one transformer.

4. The power conversion apparatus of claim 3, wherein the first heat dissipation pad is disposed between a lower surface of the main cover and an upper surface of the at least one transformer.

5. The power conversion apparatus of claim 2, further including a second heat dissipation pad disposed between the upper portion of the main housing and the lower portion of the sub-housing.

6. The power conversion apparatus of claim 5, wherein the second heat dissipation pad is disposed between an upper surface of the main cover and a lower portion of the sub-case.

7. The power conversion apparatus of claim 5, wherein the second heat dissipation pad is disposed to overlap the upper cooling unit.

8. The power conversion apparatus of claim 2,
   wherein the main cover includes a plurality of coupling bosses formed on an upper surface thereof, and
   wherein the sub-case includes a plurality of coupling ribs engaged with the plurality of coupling bosses.

9. The power conversion apparatus of claim 1, wherein the main case includes a first coolant inlet and a first coolant outlet, respectively connected to a first coolant flow passage formed between the lower coolant passage and the lower cooling plate.

10. The power conversion apparatus of claim 1, wherein a plurality of first cooling pins are formed in the lower coolant passage.

11. The power conversion apparatus of claim 1, wherein the sub-case includes a second coolant inlet and a second coolant outlet, respectively connected to a second coolant flow passage formed between the upper coolant passage and the upper cooling plate.

12. The power conversion apparatus of claim 1, wherein a plurality of second cooling pins are formed in the upper coolant passage.

13. The power conversion apparatus of claim 1,
   wherein the main housing includes a main cover, and
   wherein a second heat dissipation pad is attached to an upper surface of the main cover and in contact with a lower surface of the upper cooling plate of the upper cooling unit.

14. The power conversion apparatus of claim 1, wherein the main converter is an insulated full-bridge converter.

15. The power conversion apparatus of claim 1, wherein the sub-converter is a non-insulated boost converter.

16. The power conversion apparatus of claim 1, wherein the main housing includes an internal case fixed to an internal bottom surface of the main housing and the at least one transformer is disposed in an interior of the internal case.

* * * * *